US010319685B2

(12) United States Patent
Wong et al.

(10) Patent No.: US 10,319,685 B2
(45) Date of Patent: Jun. 11, 2019

(54) EMI SHIELDED INTEGRATED CIRCUIT PACKAGES AND METHODS OF MAKING THE SAME

(71) Applicants: TransSiP, Inc., Irvine, CA (US); Lexiwave Technology (Hong Kong) Limited, Hong Kong (CN)

(72) Inventors: Chih Wei Wong, Irvine, CA (US); Henry Lau, Lexington, MA (US)

(73) Assignee: TRANSSIP, INC., Irvine, CA (US)

(*) Notice: Subject to any disclaimer, the term of this patent is extended or adjusted under 35 U.S.C. 154(b) by 0 days.

(21) Appl. No.: 15/750,986

(22) PCT Filed: Feb. 15, 2017

(86) PCT No.: PCT/US2017/018016
§ 371 (c)(1),
(2) Date: Feb. 7, 2018

(87) PCT Pub. No.: WO2017/142978
PCT Pub. Date: Aug. 24, 2017

(65) Prior Publication Data

US 2018/0240757 A1 Aug. 23, 2018

Related U.S. Application Data

(60) Provisional application No. 62/295,480, filed on Feb. 15, 2016.

(51) Int. Cl.
*H01L 23/552* (2006.01)
*H01L 21/48* (2006.01)
(Continued)

(52) U.S. Cl.
CPC ........ *H01L 23/552* (2013.01); *H01L 21/4857* (2013.01); *H01L 21/56* (2013.01);
(Continued)

(58) Field of Classification Search
CPC . H01L 23/552; H01L 21/4857; H01L 25/165; H01L 21/56; H01L 23/49827;
(Continued)

(56) References Cited

U.S. PATENT DOCUMENTS 6,218,610 B1 * 4/2001 Suzuki .................. H01L 23/552 174/377
6,279,551 B1 10/2001 Dudderar
(Continued)

OTHER PUBLICATIONS

PCT International Search Report in PCT/US17/18016, dated May 19, 2017, 3 pgs.
PCT Written Opinion in PCT/US17/18016 dated May 19, 2017, 6 pgs.

*Primary Examiner* — Steven T Sawyer
*Assistant Examiner* — Sagar Shrestha
(74) *Attorney, Agent, or Firm* — Servilla Whitney LLC

(57) ABSTRACT

An integrated circuit package with a plurality of embedded electromagnetic interference (EMI) shielding and methods of making the same are disclosed. The integrated circuit packages include the use of a pre-assembled circuit module and an interposer. The circuit module has a plurality of spaced electrical component sections separated by a series of contiguous conductive spacers, and a first shielding means comprises the spacers, vias and an embedded conductive plane. In an example, the interposer has a second shielding means comprises conductive cavities, conductive ridges, vias, and a conduction pattern. In another example, the interposer further comprises conductive strips to form the second shielding means. The first shielding means overlaps the second shielding means to form a plurality of EMI shielded enclosures for holding the spaced electrical component sections therein.

15 Claims, 4 Drawing Sheets

100
a a'
112 110 103 104 124 126 128 102 132 108
118 114 106 116 117 120 121 122 130

(51) Int. Cl.

| | |
|---|---|
| ***H01L 21/56*** | (2006.01) |
| ***H01L 23/498*** | (2006.01) |
| ***H01L 23/538*** | (2006.01) |
| ***H01L 25/16*** | (2006.01) |
| ***H05K 1/14*** | (2006.01) |

(52) U.S. Cl.

CPC .... *H01L 23/49827* (2013.01); *H01L 23/5385* (2013.01); *H01L 25/165* (2013.01); *H05K 1/144* (2013.01); *H01L 2224/16225* (2013.01)

(58) Field of Classification Search

CPC .............. H01L 23/5385; H05K 9/0084; H05K 2201/0707; H05K 2201/10371; H05K 9/0024; H05K 9/0081; H05K 9/0022; H05K 1/181; H05K 1/111; H05K 3/0014; H05K 1/0216; H05K 3/30; H05K 3/101; H05K 1/0215; H05K 1/144

See application file for complete search history.

(56) References Cited

U.S. PATENT DOCUMENTS

| | | | | |
|---|---|---|---|---|
| 6,618,267 | B1 | 9/2003 | Dalal | |
| 8,143,097 | B2 | 3/2012 | Chi | |
| 8,279,625 | B2 * | 10/2012 | Just | H05K 1/0218<br>174/350 |
| 8,531,012 | B2 | 9/2013 | Lee | |
| 2004/0264156 | A1 * | 12/2004 | Ajioka | H01L 23/552<br>361/818 |
| 2006/0109639 | A1 * | 5/2006 | Nakano | H05K 7/1401<br>361/818 |

* cited by examiner

EMI SHIELDED INTEGRATED CIRCUIT PACKAGES AND METHODS OF MAKING THE SAME

CROSS-REFERENCE TO RELATED APPLICATIONS

This application is the National Stage entry of PCT/US2017/018016, filed on Feb. 15, 2017, which claims priority to U.S. Provisional Application No. 62/295,480, filed on Feb. 15, 2016, which are incorporated herein by reference in their entireties.

FEDERALLY SPONSORED RESEARCH

None.

SEQUENCE LISTING

None.

CLAIM OF PRIORITY

This application claims priority to U.S. Provisional Patent Application No. 62/295,480 filed on Feb. 15, 2016 titled "Method of Faraday Cage Formed within an Integrated Circuit Package with Interposer and Chip Carrier and EMI Shielded Integrated Circuit Interposer Packages Produced and Used in Electronic Assemblies Using This Method" which is incorporated by reference in its entirety.

TECHNICAL FIELD

Embodiments of the invention are in the field of semiconductor packages and, in particular, Faraday Cages formed and embedded within integrated circuit interposer and circuit module assemblies.

BACKGROUND

Increasingly miniaturized system-in-package (SiP) devices used in a growing number of static and mobile devices present problems of electromagnetic interference (EMI) to signal integrity while at the same time some of the components can radiate electromagnetic energy which can interfere with other circuit elements. For example, a SiP device packaging a digital processor chip generates electromagnetic energy which can interfere with the operation of a high sensitivity low noise radio frequency amplifier in the same SiP. The nature of these high frequency radiative signals along with the increasing proximity of components on the circuit module substrate and printed wiring board (PWB) create the need for effective isolation between components and for improved EMI shielding.

The conventional method used for EMI shielding is to form a 6 sided structure, ensuring complete enclosure of the components and creating a Faraday Cage. In all cases involving circuit modules and circuit boards, a ground or reference plane in the circuit module substrate or PWB forms one side of the enclosure, while the rest of the structure may be formed using various techniques. For example, in one approach a housing assembly is used as a cover of the circuit module substrate or PWB assembly thereby providing EMI enclosure. Various cavities on the inside of the housing assembly are metallized on the interior surface and are electrically coupled to the circuit module substrate or PWB using a conductive elastomeric gasket, while the necessary contact force at the gasket interface is achieved through mechanical fasteners such as clips or screws. Another, more common approach uses preformed conductive shield cans: sheet metal enclosures with and without removable lids that attach directly to the circuit module substrate or PWB, so that the assembled SiP or PWB incorporates the shielding.

Components on the vast majority of SiPs and PWBs today and all high performance systems are assembled using surface-mount technology (SMT). This process involves screen printing solder paste onto the bare board or substrate, placement of components aligned to the printed solder paste pattern, and running the populated boards through a solder reflow oven.

When metal cans are used as shields, they will typically have an array of holes or apertures stamped into the top which permit more even heat distribution during the reflow process. The shield cans are normally stamped from sheet metal and are formed into individual rectangular boxes. They are mechanically and electrically attached to the circuit module substrate or PWB in the same soldering process as the components using ground or reference tracks provided within the component layer circuitry for this purpose, and are typically placed over the components as the last step before the board goes through the reflow oven.

Since the shield cans are covering the components during the solder reflow process, this may interfere with the thermal profile necessary to achieve well-formed and reliable solder joints. With the shield can soldered in place, inspection of solder joints becomes impossible, and rework becomes more complex and problematic should that be required. As a result, shield cans are available with snap-on lids, but this often adds size and complexity to the shield enclosure and may compromise the shielding effectiveness of the can.

In compact, high density designs, and in particular modular assemblies operating at RF equivalent frequencies packaged as components for assembly onto a motherboard, preformed metal cans become less attractive. Components are placed closer together, so the ground or reference tracks defining the perimeter of the shielded area become very narrow. This makes the use of multiple, single cavity shield cans impractical when several cavities are needed.

Another limitation of this approach derives from the assembly process. Since the shield cans are mounted and fixed by reflow of solder paste, it becomes impractical to mount them on both sides of a circuit module substrate or a circuit board, as the shield cans mounted in the first pass would fall off in the second pass unless glued in place. Gluing the cans in the first pass would eliminate any possibility for rework or inspection unless removable lid types were used, adding complexity, cost, and degrading the shielding capabilities of the enclosure.

Yet another limitation is found in the use of shield cans in that cleaning of flux residues and other byproducts of the reflow operation becomes problematic if not impossible under the shield can. Yet at the same time the shield can cannot provide a hermetic enclosure due to the need for either holes or a removable lid during the reflow process as discussed above.

Some of these issues are addressed when a Faraday Cage electromagnetic shielding enclosure may be created inside the circuit module substrate or circuit board using combinations of inner layer patterning for the top and bottom and conductive pillars or vias for the walls of the cage, however this approach requires that all components requiring shielding be placed within the cage, i.e. embedded within the circuit module substrate or circuit board. As a consequence, this approach is often impossible, not feasible, and/or too expensive to use in the construction of a high density device.

SUMMARY OF THE INVENTION

Embodiments of the present invention include the use of a pre-assembled circuit module and interposer to provide a plurality of EMI shielded structures for components mounted on the underside or both sides of a circuit module substrate within a single package and methods to form such semiconductor packages, thereby substantially reducing both area and volume necessary for the construction of shielded assemblies.

In one embodiment, a semiconductor package includes a Faraday Cage formed when a pre-tested circuit module with components mounted thereon and incorporating a suitable ground or reference plane is affixed to an interposer structure containing cavities which provide clearance for the components on the underside of the circuit module. The walls and floor of said cavities are coated with a suitable conductive composition, e.g. plated copper, and ridges between the cavities and contact pads or conduction paths around the perimeter of the mounting surface on which the circuit module is placed make contact with corresponding contact pads or conduction paths on the circuit module, thereby creating an equipotential between the cavity walls and floor and the ground or reference plane in the circuit module and creating a closed Faraday Cage. An alternative embodiment provides lateral shielding using rows of vias or conductive posts formed around the cavity within the interposer and electrically connected to both the circuit module reference plane and the shield plane on the floor of the cavity, said vias or posts having a spacing appropriate to the formation of the Faraday Cage. In a further embodiment, the rows of vias within the interposer are matched by rows of vias in the circuit module which connect contact pads or conduction paths or strips on the carrier surface to the carrier ground or reference plane. The carrier vias are placed such that they are coaxial with the vias in the interposer, thereby minimizing dislocations within the electromagnetic field formed by the via array. As the circuit module can be assembled and functionally tested before being mounted into the interposer, the present invention further enables simplified full cleaning and inspection of both sides of the assembled module as well as functional testing and eliminates the need for a shield can on at least one side of the circuit module. In a further embodiment the present invention can also provide an environmental or hermetic, sealed environment for circuit elements on at least one side of the circuit module.

BRIEF DESCRIPTION OF THE DRAWINGS

The foregoing summary, as well as the following detailed description of the invention, will be better understood when read in conjunction with the appended drawings. For the purpose of illustrating the present invention, there are shown in the drawings embodiments which are presently preferred. It should be understood, however, that the invention is not limited to the precise arrangements and instrumentalities shown. With reference to the drawings.

DETAILED DESCRIPTION

Figure 1A:
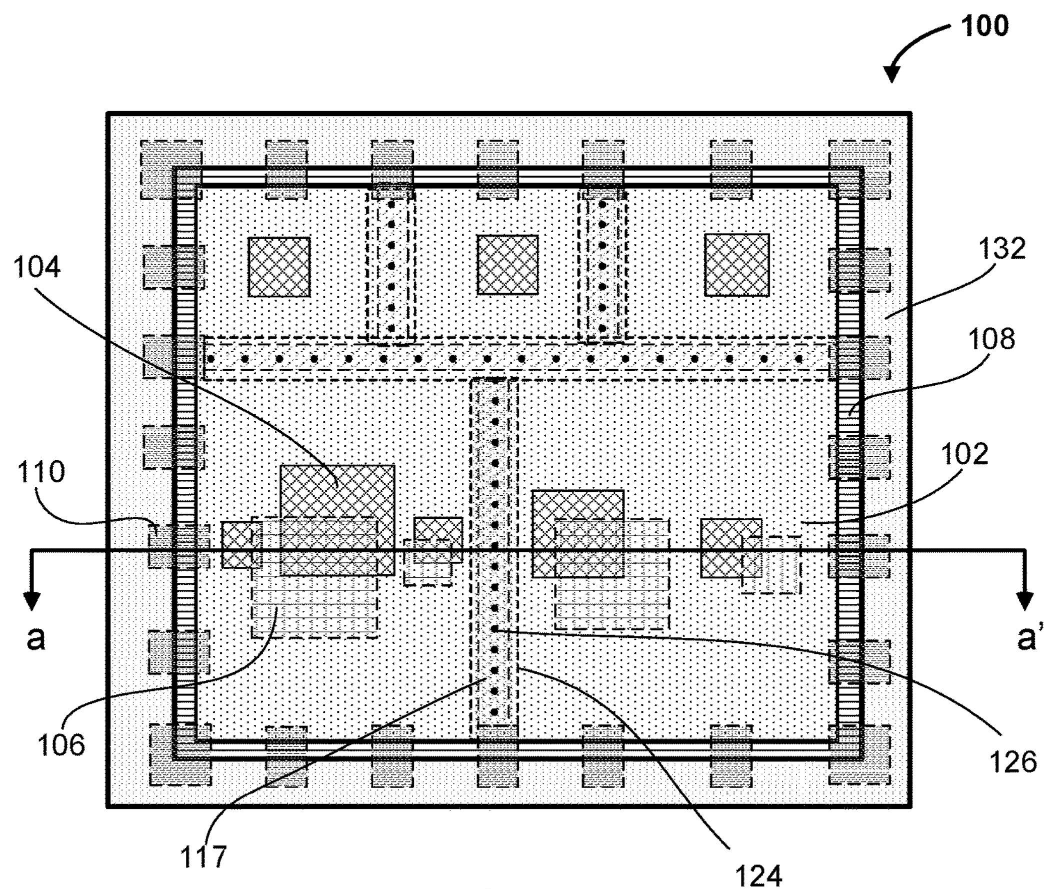
FIG. 1A illustrates a plane perspective view of an EMI shielded integrated circuit interposer package with an interposer assembly and circuit module assembly in accordance with an embodiment of the present invention.

EMI shielded integrated circuit interposer packages with interposer and circuit module assemblies and methods to form such semiconductor packages are described. In the following description, numerous specific details are set forth, such as packaging architectures and material regimes, in order to provide a thorough understanding of embodiments of the present invention. It will be apparent to one skilled in the art that embodiments of the present invention may be practiced without these specific details. In other instances, well-known features, such as via structure and integrated circuit design layouts, are not described in detail in order to not unnecessarily obscure embodiments of the present invention. Furthermore, it is to be understood that the various embodiments shown in the Figures are illustrative representations and are not necessarily drawn to scale.

Although interposer packages are known and have been used for many years, their function has generally been limited to redistribution of electrical networks such that a more reliable and easily manufacturable mounting pattern may be achieved on the next level substrate within an electronic assembly, as for example between a complex, high density area array circuit module package and an underlying printed wiring board. No known interposer package has embodied EMI shielding consisting of Faraday Cage cavities.

The preferred embodiment of the present invention includes an interposer formed with cavity or cavities and a circuit module stacked on its top. The interposer combines well-known glass-reinforced epoxy or other suitable dielectric materials with electrically conductive ground/reference and signal layers and vias or conductive posts which may be formed using any of the well-known fabrication processes common to the printed wiring and integrated circuit package substrate industries. Furthermore, by utilizing sequential lamination processes, cavity or cavities of precise dimensions may be formed in the first lamination step, providing well-controlled, tuned resonant electromagnetic shielding environments for the enclosed components. In the event there are multiple cavities in the design, ridges are formed between the cavities within the interposer for the purpose of enclosing the correspondingly spaced circuit elements on the circuit module. Internal surfaces of said cavities are made electrically conductive using plated copper or other methods well-known in the art, thereby forming a contiguous electromagnetic barrier. Alternatives using lines of conductive vias or posts spaced around the perimeter of the cavity or cavities may also be employed, if the EMI shielding requirements enable this approach.

A functional electronic subassembly is formed by mounting components on a circuit module substrate consisting of a plurality of electrically conductive power, ground/reference, and signal layers in a suitable dielectric which is typically a reinforced polymer such as Epoxy, Bismaleimide Triazine, Polytetrafluoroethylene (PTFE) or any of a number of suitable materials including inorganic substrates such as alumina, glass, silicon, and other dielectric materials, forming a SiP device. The EMI-sensitive components may be mounted on the underside of the SiP device, and, in the event of multiple circuit functional blocks, may be divided into a plurality of segments on the circuit module forming the SiP device (for example, a digital processor is in one segment and a radio frequency low noise amplifier is in another segment). Conductive spacers are formed in the circuit layout on the surface layer of the circuit module around the perimeter of each of the segments. The conductive spacers are electrically coupled to the corresponding ridges on the interposer when the circuit module is bonded to the interposer, and vias within the circuit module provide electrical connection between said conductive spacers and a contiguous ground or reference plane inside the circuit module, thereby enclosing the corresponding circuit segments on the underside of the circuit module within a 6 sided equipotential structure formed by the conductive walls and floor of the cavity and the circuit module internal ground/reference plane. This structure forms a Faraday Cage around the corresponding circuit segment and within the interposer.

The circuit module is provided with contact pads or conduction paths around the perimeter and patterning within the circuit layout such that solder or other conductive connections are formed between the pads or the paths on the circuit module and corresponding terminals on the interposer. Printed wiring patterns and vias or conductive posts within the interposer carry electrical signals from the circuit module to contact pads or conduction paths formed on the bottom side of the interposer intended for connection to the next level of interconnections within a system of which the EMI shielded integrated circuit interposer package comprising the interposer and circuit module forms a part.

In a further embodiment of the present invention, the thermal conductivity of the interposer assembly may be enhanced through the provision of thermal slugs within the interposer which provide low-impedance thermal pathways to appropriate heat sinks or thermal pads on the underlying substrate.

In yet a further embodiment, the assembled circuit module is encapsulated by forming a containment ring on the cavity side of the interposer and filling the chamber thereby formed with a suitable epoxy, silicone, or other appropriate material to ensure environmental or hermetic sealing of both the topside components and underlying cavities.

In yet a further embodiment a metal or plastic lid may be affixed to the containment ring or to the interposer without the containment ring. If necessary, the circuit module may be further fitted with a topside shield can. Other combinations of encapsulation and shielding may become self-evident to one skilled in the art, and are within the scope of the present invention.

Figure 1B:
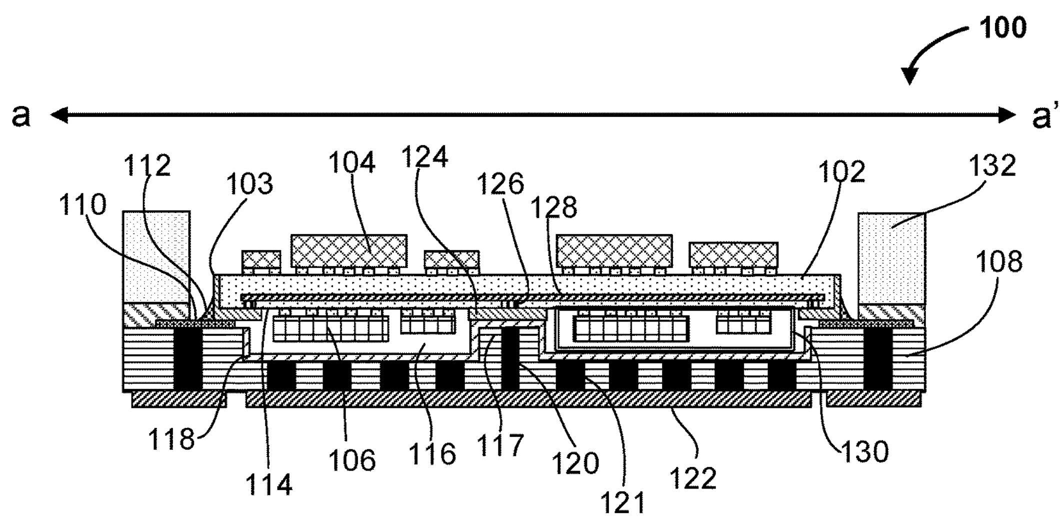
FIG. 1B illustrates a cross-sectional view of the EMI shielded integrated circuit interposer package with the interposer assembly and circuit module assembly of FIG. 1A, in accordance with an embodiment of the present invention.

Referring now to the drawings in detail, wherein like numerals indicate like elements throughout, there is shown a presently preferred embodiment of the assembled interposer and circuit module assemblies, indicated generally in FIG. 1A and FIG. 1B. An EMI shielded integrated circuit interposer package 100 comprises a circuit module 102 having contact pads or conduction paths 103 around the perimeter and a variety of components 104 are mounted on the top surface of the circuit module 102 and more specifically circuit components 106 requiring EMI shielding mounted on the underside housed in an interposer 108 and bonded to corresponding contact pads or conduction paths 110 around the perimeter thereon by means of reflowed solder paste 112, or conductive adhesive, or other industry standard methods well known to those skilled in the art and within the scope of the present invention. Said circuit components 106 which need EMI shielding are positioned preferentially on the bottom side 114 of the circuit module 102, within cavities 116 formed in interposer 108 for this purpose. Ridges 117 and inner surfaces of said cavities 116 are coated with a conductive layer to form a first three dimensional (3D) equipotential structure 118. Said conductive layer may be formed by deposition of copper or other suitable metal, or may consist of conductive compositions according to well-known processes and practices in the printed wiring and integrated circuit package substrate industries. The first 3D equipotential structure 118 is connected to ground or reference potential provided by an external plane or conduction pattern 122 on the bottom side of interposer 108, such that external plane or conduction pattern 122 is intended for connection to the next level of equipotential reference plane or ground plane within a system. The said interconnection between 3D equipotential structure 118 and external plane or conduction pattern 122 may be formed by arrays of vias 120 and 121 within interposer 108. Contiguous conductive spacers 124 are formed in the circuit layout on the surface of the circuit module around the perimeter of spaced circuit components 106 on the bottom side 114 of circuit module 102. Said contiguous conductive spacers 124 are electrically connected by arrays of vias 126 to conductive plane 128 located within circuit module 102 to form a second 3D equipotential structure. The said first 3D equipotential structure 118 and second 3D equipotential structure are electrically coupled together to form a Faraday Cage or arrays of Faraday Cages 130 within the EMI shielded integrated circuit interposer package 100.

In a further embodiment of the present invention, a containment ring or standoff perimeter 132 may be affixed to the interposer 108 providing a chamber for encapsulation of circuit module 102 and/or mounting of a metal or plastic lid on EMI shielded integrated circuit interposer package 100.

Figure 2:
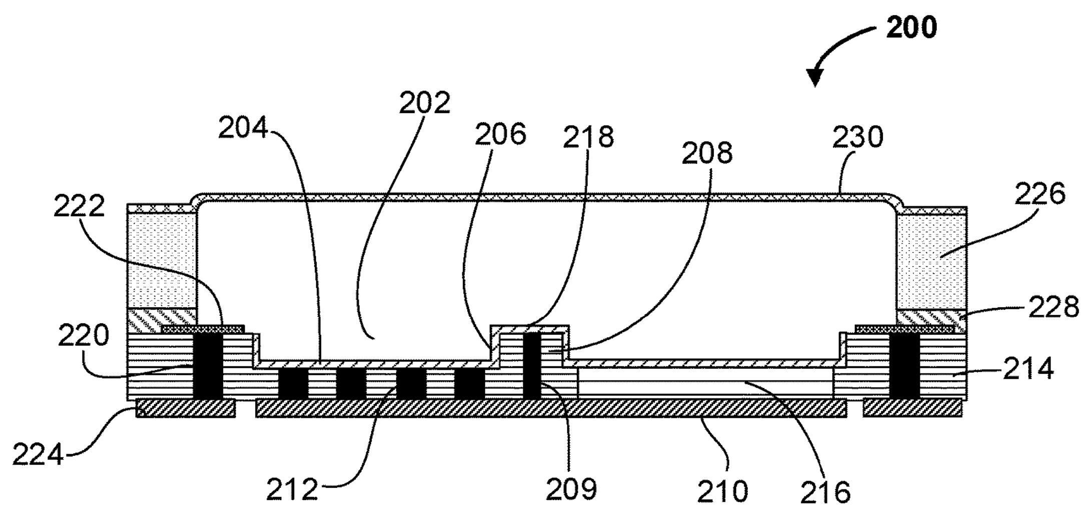
FIG. 2 illustrates a partial cross-sectional view of an EMI shielded integrated circuit interposer package presenting another embodiment of the interposer assembly in accordance with the present invention, the interposer assembly showing details of the cavity construction, wiring layers, and optional containment ring/standoff perimeter and lid.

Referring to the EMI shielded integrated circuit interposer package 200 in FIG. 2, the interior of cavities 202 in interposer substrate 214 are coated with a conductive layer on the cavity bottom plane 204 and sidewalls 206. Said conductive layer may consist of deposited copper or other metal, or may consist of conductive compositions according to well-known processes and practices in the printed wiring and package substrate industries. Said conductive layer is connected by arrays of vias 212 to ground or reference potential provided by an external plane or conduction pattern 210 intended for connection to the next level of reference or ground circuits within an electronic system, thereby forming a first equipotential reference structure. These vias may be formed by any of several well-known processes involving mechanical drilling, laser drilling, or plasma ablation, with subsequent plating of a cylindrical or solid metal deposit e.g. copper within the hole, or by formation of solid posts through plating of a suitable metal e.g. copper or deposition of a suitable conductive composition, e.g. silver-filled epoxy. Other via formation methods and materials may become self-evident to one skilled in the art, and are within the scope of the present invention.

In a preferred embodiment, the via formation method and process does not leave open apertures in either cavity bottom plane 204 or external plane or conduction pattern 210.

Again with reference to the EMI shielded integrated circuit interposer package 200 in FIG. 2, in a further embodiment of the present invention vias or conductive posts 212 are substituted by a solid slug or inlay 216 formed of a suitable material e.g. copper for the purpose of maximizing the conductive cross-section perpendicular to the conduction pattern 210, thereby forming a low impedance thermal pathway from cavity bottom plane 204 to bottom conduction pattern 210.

In the event a plurality of cavities 202 are required within the interposer substrate 214, these are separated by ridges 208. Conductive strips 218 are formed contiguously with cavity sidewalls 206 as circuit elements using well-known printed wiring or package substrate processes on ridges 208 for the purpose of providing electrical continuity between cavity bottom plane 204, sidewalls 206, and overlying circuit module spacers 124. Said conductive strips 218 are electrically connected to external plane or conduction pattern 210 by vias 209 formed using any method well-known in the printed wiring or package substrate industries. Conduction pattern 210 is intended for connection to the next level of equipotential reference plane or ground plane within a system. Vias 220 provide connections from contact pads or conduction paths 222 within interposer substrate 214 to pads 224 on the bottom of EMI shielded integrated circuit interposer package 200. Said pads 224 may be directly joined to an underlying substrate, or may be provided with solder balls or other appropriate means of interconnection to the next level substrate.

Again with reference to the EMI shielded integrated circuit interposer package 200 in FIG. 2, in a further embodiment of the present invention, a containment ring or standoff perimeter 226 may be formed on interposer substrate 214 using any of a series of processes well-known in printed wiring board or integrated circuit substrate manufacturing such as lamination using a low-flow prepreg or adhesive 228. Other methods and materials may become self-evident to one skilled in the art, and are within the scope of the present invention. In the present embodiment, said containment ring or standoff perimeter 226 consists of a dielectric material suitably chosen such that eventual deformation of interposer substrate 214 due to mismatch of coefficients of thermal expansion between said interposer substrate 214 and containment ring or standoff perimeter 226 is minimized. In a further embodiment containment ring or standoff perimeter 226 serves as a standoff for mounting a metal or plastic lid 230 on assembled EMI shielded integrated circuit interposer package 200. Subsequent processing, e.g. mounting of circuit module 102 and encapsulation and/or sealing of the assembled EMI shielded integrated circuit interposer package 200 may be the same or similar to those described above for EMI shielded integrated circuit interposer package 100.

Figure 3A:
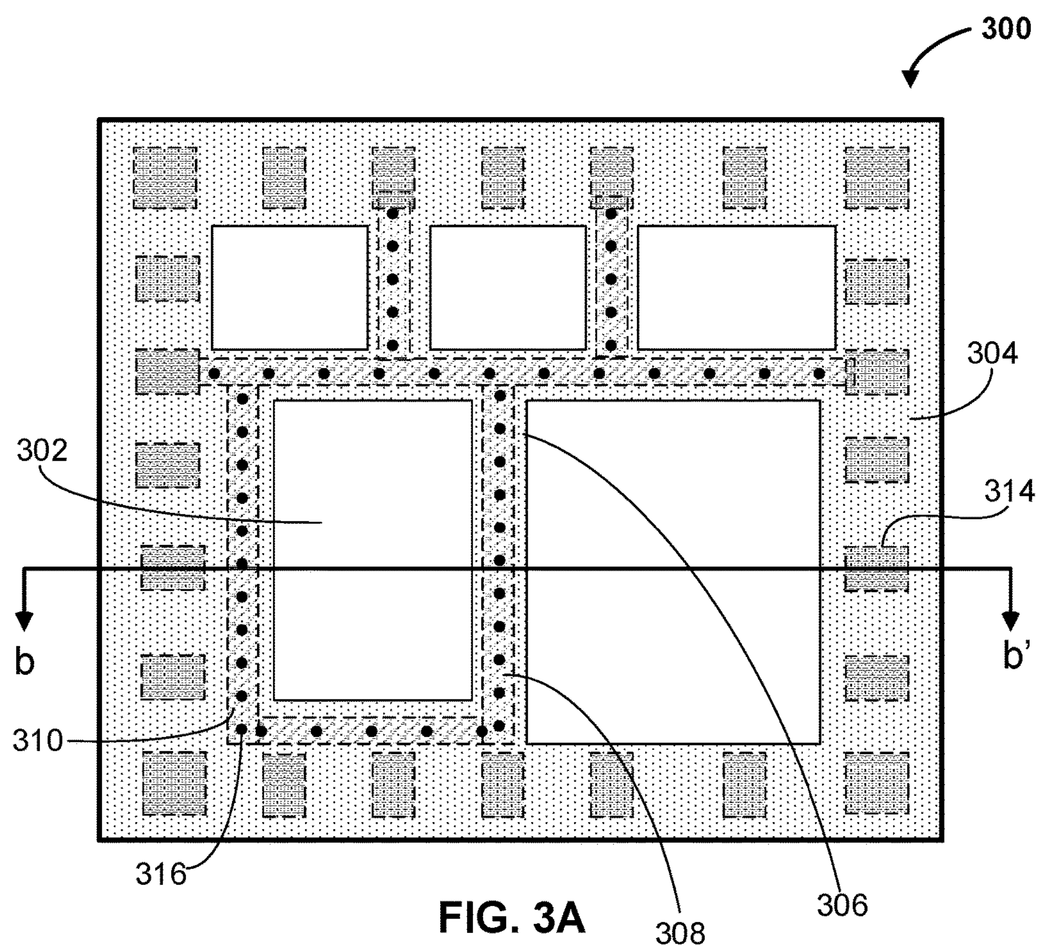
FIG. 3A illustrates a plane view of an EMI shielded integrated circuit interposer package with an array of cavities and various ways of lateral shielding adjacent the cavities using conductive strips, pads and posts or vias in accordance with the present invention.
Figure 3B:
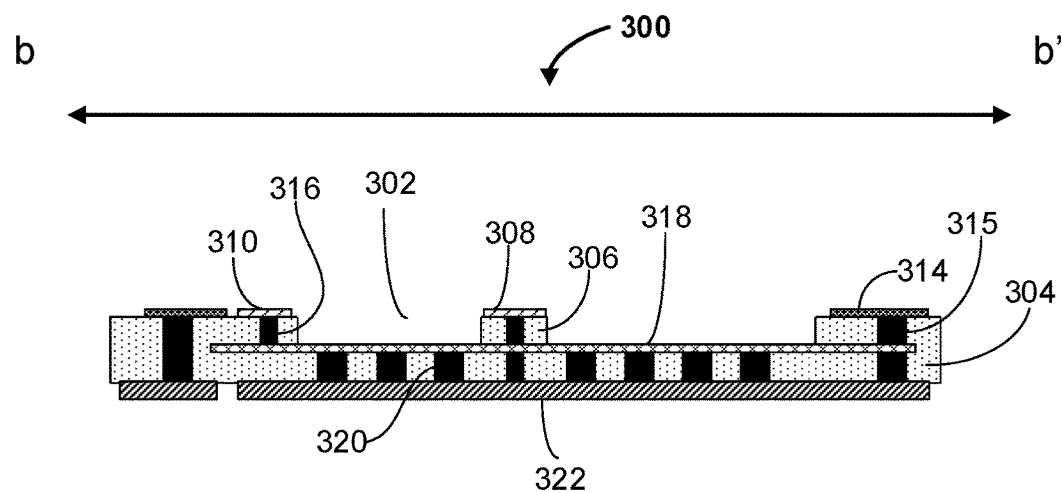
FIG. 3B illustrates a partial cross-sectional view of the integrated circuit interposer package of FIG. 3A in accordance with an embodiment of the present invention, the interposer package showing creation of a three dimensional (3D) equipotential structure using conductive strips, pads, and posts or vias.

Referring to FIGS. 3A and 3B, another embodiment of EMI shielded integrated circuit interposer package 300 in accordance with the present invention forms a plurality of electromagnetic shield cavities 302 within an interposer substrate 304. Said cavities 302 are separated by ridges 306 which have a conductive strip 308 running along the length of their top surface, said conductive strips 308 being formed as circuit elements using well-known printed wiring or integrated circuit package substrate processes. Other conductive strips 310 are formed on the surface of interposer substrate 304 between cavities 302 and the edges of said interposer substrate 304, electrically connected to conductive plane 318 by arrays of vias 316 and thereby at equipotential thereto. Arrays of vias 316 are positioned along conductive strips 308 and 310 at intervals appropriate to the desired shielding functions of electromagnetic energy around the perimeter of cavities 302, being typically spaced at equal or less than 1/10 of the fee space wavelength of at least one operating frequency bands or electromagnetic energy of interest of the circuit module 102. Other arrays of vias 320 provide electrical connection between conductive plane 318 and external conductive plane or conduction pattern 322. Said external conductive plane or conduction pattern 322 may be electrically connected to an underlying substrate, intended for connection to the next level of reference or ground circuits within an electronic system.

In yet a further embodiment, said external conductive plane or conduction pattern 322 may be employed as a reference or ground plane for an underlying structure, thereby forming an equipotential reference layer for Faraday Cage(s) formed in overlying or underlying substrates in accordance with the present invention.

In yet another embodiment, conductive pads 314 formed along the perimeter and on the surface of interposer substrate 304 provide terminals for establishing and extending equipotential connections from the coplanar conductive plane 318 to another conductive plane on a circuit module thereon to form an enclosed equipotential or EMI shielded structure. Conductive pads 314 and vias 315 along the perimeter of cavities 302 are positioned at intervals appropriate to the desired shielding functions of electromagnetic energy around the perimeter of said cavities 302, being typically at equal or less than 1/10 the free space wavelength of at least one operating frequency bands or electromagnetic energy of interest of the circuit module 102. An equipotential surface within said cavities 302 may be formed by any combination of conductive plane 318, conductive strips 310, conductive strips 308, conductive pads 314, and arrays of vias 315 and 316. Subsequent processes, e.g. mounting of circuit module and encapsulation and/or sealing of assembled EMI shielded integrated circuit interposer package 300 may be the same or similar to those described above for the EMI shielded integrated circuit interposer package 100 and 200.

Figure 4:
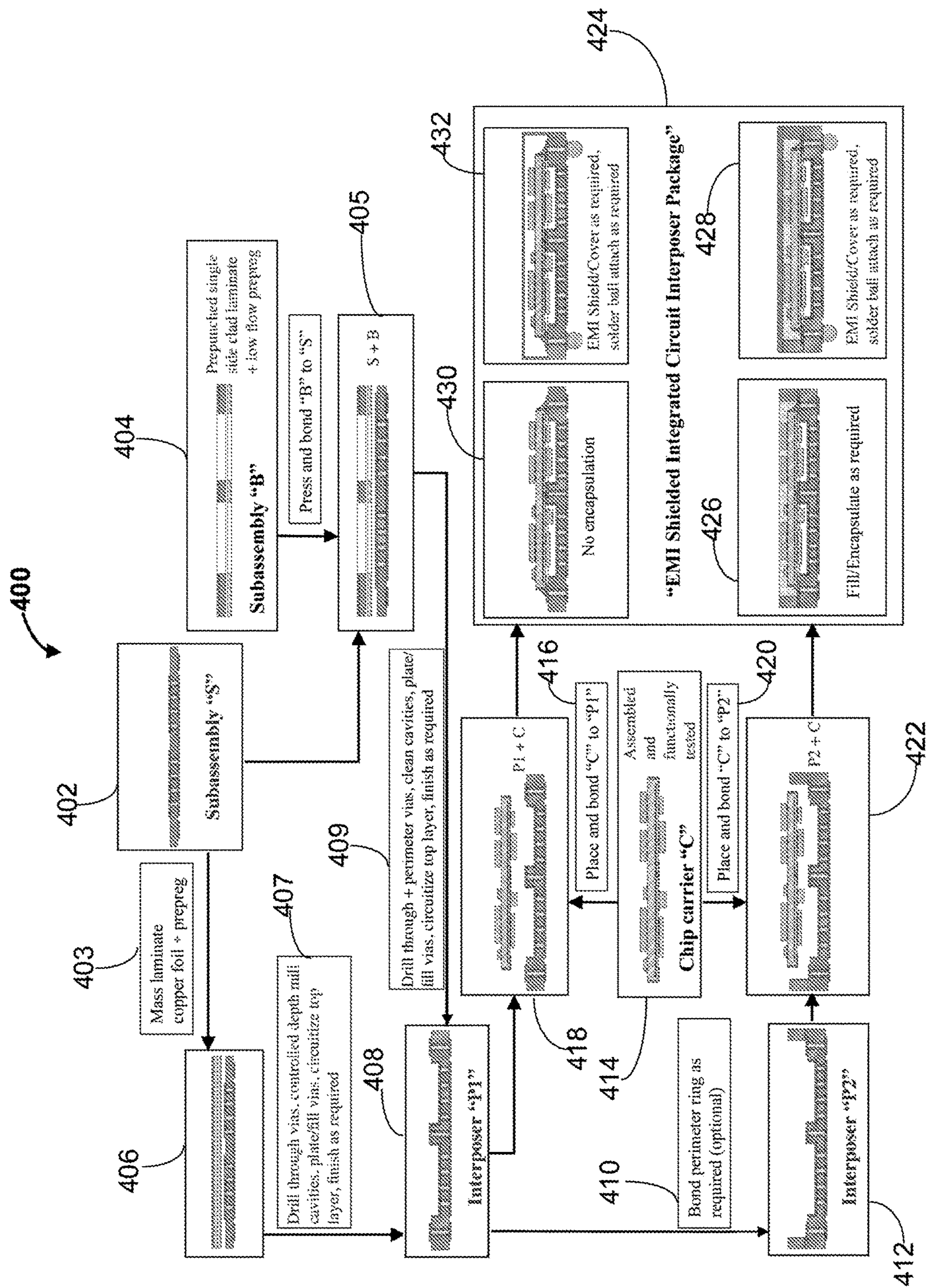
FIG. 4 illustrates a process flow for a method of fabricating EMI shielded integrated circuit interposer packages, in accordance with embodiments of the present invention.

Referring now to process flow for a method 400 of FIG. 4 of fabricating EMI shielded integrated circuit interposer packages, a subassembly 402 with conductor layers and vias is fabricated using processes well-known to the printed wiring and package substrate industries. In a preferred embodiment, the via formation method does not leave open apertures on the top or bottom conductive surfaces of said subassembly 402.

In one embodiment, a second prepunched subassembly 404 is pressed and bonded to the first subassembly 402 in process 405 to form interposer 408 with the intended locations of cavities in place. Additional conductor layers and vias within interposer 408 may be formed by any of several well-known processes 409 involving plating, metal deposition, sputter deposition, mechanical drilling, laser drilling, or plasma ablation, with subsequent plating of a cylindrical or solid metal deposit, e.g. copper within the hole, or by formation of solid posts through plating of a suitable metal, e.g. copper or deposition of a suitable conductive composition, e.g. silver-filled epoxy. The via formation method and process preferably does not leave open apertures in interposer 408. Other combinations of processes 409 for circuitization, via formation methods, and cavity cleaning may become apparent to one skilled in the art, and are within the scope of the present invention. Following via and cavity metallization or conductive coating and subsequent circuitization of interposer 408 external conductive layers, said interposer 408 is finished as required for subsequent operations, including but not limited to applicable overplates, solderability finishes, organic coatings, soldermasks, and/or insulating dielectrics.

Referring again to process flow 400 of FIG. 4, in another embodiment additional conductor layers 406 may be bonded to subassembly 402 by using well-known mass lamination processes 403, thereby forming interposer 408. Additional conductor layers and vias within interposer 408 may be formed by any of several well-known processes 407 involving plating, metal deposition, sputter deposition, mechanical drilling, laser drilling, or plasma ablation, with subsequent plating of a cylindrical or solid metal deposit, e.g. copper within the hole, or by formation of solid posts through plating of a suitable metal, e.g. copper or deposition of a suitable conductive composition, e.g. silver-filled epoxy. The via formation method and process preferably does not leave open apertures in interposer 408. Other combinations of processes 407 for circuitization and via formation methods may become self-evident to one skilled in the art, and are within the scope of the present invention. Cavities are formed using controlled depth milling 407, or ablative processes such as e.g. laser, in interposer 408. Other methods may become apparent to one skilled in the art and are within the scope of the present invention. Said interposer 408 is comprised of conductive planes, conductive strips, ridges, contact pads or conduction paths, and vias as described in association with FIGS. 1A, 1B, 2, 3A and 3B. Following via and cavity metallization or conductive coating and subsequent circuitization of interposer 408 external conductive layers, interposer 408 is finished as required for subsequent operations, including but not limited to applicable overplates, solderability finishes, organic coatings, soldermasks, and/or insulating dielectrics.

Again with reference to process flow 400 of FIG. 4, assembled and functionally tested circuit module or chip carrier 414 incorporating features described in association with FIGS. 1A, 1B, 2, 3A and 3B is disposed and bonded with reference to process 416 to the finished and tested interposer 408 using any appropriate method known in the printed circuit and package substrate assembly industries, typically using reflowed solder, low temperature sintering, or conductive adhesives, thereby forming an assembled EMI shielded integrated circuit package 430. In the event that EMI shielded integrated circuit package 430 should be covered or environmental sealed or hermetically sealed so as to protect the exposed components mounted thereon, a shield can or cover or lid made by metal, polymer or other materials well-known in integrated circuit packaging may be disposed and bonded to the integrated circuit package 430, thereby forming the final environmental or hermetic sealed and EMI shielded integrated circuit interposer packages 432. Other methods may become apparent to one skilled in the art and are within the scope of the present invention.

Again with reference to process flow 400 of FIG. 4, yet in an alternative method to provide environmental or hermetic sealing to EMI shielded integrated circuit package 430 so as to protect the exposed components mounted thereon, a containment ring or standoff perimeter with reference to process 410 may be bonded to interposer 408 so as to provide a chamber above the top cavity side of interposer 408 to form interposer 412 using any of a series of processes well-known in printed wiring board or integrated circuit substrate manufacturing such as lamination using a low-flow prepreg or adhesive. An assembled and functionally tested circuit module or chip carrier 414 incorporating features described in association with FIGS. 1A, 1B, 2, 3A and 3B is disposed and bonded with reference to process 420 to the finished and tested interposer 412 using any appropriate method known in the printed circuit and package substrate assembly industries, typically using reflowed solder, low temperature sintering, or conductive adhesives. Said containment ring or standoff perimeter 410 consists of a dielectric material suitably chosen such that eventual deformation of interposer 412 due to mismatch of coefficients of thermal expansion between said interposer 408 and containment ring or standoff perimeter with reference to process 410 is minimized.

Again with further reference to process flow 400, in the event the assembled EMI shielded integrated circuit interposer package with reference to process 422 requires further closure and/or hermetic sealing, the chamber formed by containment ring or standoff perimeter formed in process 410 may be filled with a suitable epoxy, silicone, or other appropriate encapsulant material to ensure environmental or hermetic sealing of both the topside components and underlying cavities, thereby forming the final environmental or hermetic sealed and EMI shielded integrated circuit interposer packages 426.

The environmental or hermetic sealed and EMI shielded integrated circuit interposer package 426 may then be further closed with a lid formed of metal or plastic, bonded in such a manner as to ensure both sealing and protection of the underlying circuitry of the covered EMI shielded integrated circuit interposer package 428. In a further embodiment of the present invention, in the case that shielding of topside components is desired in addition to that provided to bottomside components by the Faraday Cage(s) within interposers 408 and 412, containment ring or standoff perimeter with reference to process 410 may be rendered electrically conductive by application of a suitable coating via spray, vapor deposition or other appropriate method, thereby forming an electrical connection between the lid and the ground or reference planes used for formation of the Faraday Cage(s) within interposers 408 and 412. Other methods for rendering the lid equipotential to the Faraday Cage(s) may become self-evident to one skilled in the art, and are within the scope of the present invention. Following circuit module bonding, and sealing/covering as may be required, final finishing is performed, including but not limited to applicable overplates, solderability finishes, organic coatings, soldermasks, insulating dielectrics, solder ball attachment, singulation, and the like, the application of which is determined by the final design and fall within the scope of the present invention. At this point a varieties of EMI shielded integrated circuit interposer packages 424 with the provisions of environmental and hermetic sealing are disclosed.

The invention claimed is:

1. An electromagnetic interference shielded integrated circuit package, comprising:

a circuit module having first and second opposing surfaces;

a series of contiguous conductive spacers disposed on at least one of said surfaces;

a conductive plane sandwiched between said surfaces;

a plurality of spaced electrical component sections being separated by said conductive spacers;

first shielding means disposed beneath and adjacent to said respective spaced electrical component sections;

an interposer having a plurality of conductive cavities on a recessed top surface;

a conduction pattern disposed on a bottom opposing surface of said interposer;

a series of contiguous conductive ridges positioned in between each adjacent said cavities;

second shielding means disposed on at least one of the interior surfaces of said conductive cavities and adjacent said respective conductive cavities;

wherein said circuit module is mounted over said interposer, said spaced electrical component sections are disposed inside a space of said respective conductive cavities, said conductive plane is electrically coupled to said conductive spacers, said conductive spacers, from a top-down perspective, overlaps and are electrically coupled to said respective conductive ridges so that said first shielding means is disposed over and electrically coupled to said respective second shielding means and thereby forms a plurality of closed electromagnetic interference shielded enclosures for holding said respective spaced electrical component sections therein, and wherein said electromagnetic interference shielded enclosures are electrically coupled to said conduction pattern which is electrically coupled to a ground potential of a system;

whereby said circuit module can be assembled and individually tested before being mounted over said interposer, and thereby said electromagnetic interference shielded integrated circuit package further enables simplified manufacturing and assembly process by eliminating multiple bulky shield can installations, as well as simplifies inspection and functional testing so as to enable compact and thinner system in package design for a complex electronics system.

2. The electromagnetic interference shielded integrated circuit package of claim 1 wherein said circuit module further comprising a plurality of first conduction paths along the outer perimeter of said circuit module, and wherein said interposer further comprising a plurality of second conduction paths along the outer perimeter of said interposer; and said first conduction paths are aligned and electrically connected to said respective second conduction paths.

3. The electromagnetic interference shielded integrated circuit package of claim 1 wherein said first shielding means comprises said conductive spacers, said conductive plane, and further comprises a plurality of conductive vias; wherein said conductive vias interconnect said conductive spacers and said conductive plane.

4. The electromagnetic interference shielded integrated circuit package of claim 3 wherein each of said vias are spaced a distance of equal or less than one tenth of a free space wavelength of at least one operating frequency band of said circuit module apart; so that a first vertical electromagnetic interference shielding plane is formed by said vias and being positioned perpendicularly between said respective conductive spacers and said conductive plane.

5. The electromagnetic interference shielded integrated circuit package of claim 1 wherein said second shielding means comprises a conductive material disposed on at least one interior surface of said conductive cavities or an inlay of conductive material disposed along the bottom surfaces of said conductive cavities; a first series of conductive vias interconnected said conductive interior surface of said conductive cavities or said inlay of conductive material thereof and said conduction pattern; and a second series of conductive vias interconnected said conductive ridges and said conduction pattern.

6. The electromagnetic interference shielded integrated circuit package of claim 5 wherein each of said second series of conductive vias are spaced a distance of equal or less than one tenth of a free space wavelength apart of at least one operating frequency band of said circuit module apart; so that a second vertical electromagnetic interference shielding plane is formed by said second series of vias and positioned perpendicularly between said conductive ridges and said conduction pattern.

7. The electromagnetic interference shielded integrated circuit package of claim 5 wherein said second shielding means further comprising a solid slug sandwiched between said conductive cavities and said conduction pattern so as to enable a low impedance thermal pathway thereof, wherein said solid slug electrically connects said conductive cavities and said conduction pattern, and wherein said solid slug is made with a material comprising copper.

8. The electromagnetic interference shielded integrated circuit package of claim 5 wherein said second shielding means further comprising a series of conductive strips positioned between the outer perimeter of said conductive cavities and the edges of said interposer on said recessed top surface, and a third series of conductive vias electrically coupled said conductive strips to said conductive cavities; wherein said conductive strips are electrically coupled to said respective conductive spacers on said recessed top surface.

9. The electromagnetic interference shielded integrated circuit package of claim 1 further comprising encapsulation means disposed above said interposer and said circuit module for providing environmental or hermetic sealing thereof.

10. The electromagnetic interference shielded integrated circuit package of claim 9 wherein said encapsulation means is a cover being disposed over said interposer and said circuit module.

11. The electromagnetic interference shielded integrated circuit package of claim 9 wherein said encapsulation means comprising a containment ring or standoff perimeter disposed over the edges of said interposer and thereby surrounded said circuit module, and a cover disposed over said containment ring or standoff perimeter.

12. The electromagnetic interference shielded integrated circuit package of claim 9 wherein said encapsulation means comprising a containment ring or standoff perimeter disposed over the edges of said interposer and thereby surrounded said circuit module, and a coplanar chamber is formed thereto; and wherein, from a top perspective, said circuit module being disposed inside said chamber, and an encapsulant disposed inside said chamber.

13. The electromagnetic interference shielded integrated circuit package of claim 12 wherein said encapsulation means further comprising a cover disposed over said containment ring or standoff perimeter.

14. The electromagnetic interference shielded integrated circuit package of claim 1 further comprising a conductive containment ring or conductive standoff perimeter disposed over the outer edges of said interposer and thereby surrounded said circuit module, wherein said conductive containment ring or conductive standoff perimeter electrically coupled to a common potential member selected from the group consisting of said conductive cavities, said conductive spacers, said conductive ridges, said conductive plane, said conduction pattern, said first shielding means and said second shielding means.

15. A method of manufacturing an electromagnetic interference shielded integrated circuit package, comprising:

providing a circuit module having first and second opposing surfaces;

providing a series of contiguous conductive spacers being disposed on at least one of said surfaces;

providing a plurality of spaced electrical component sections being separated by said conductive spacers;

providing first shielding means being disposed beneath and adjacent to said respective spaced electrical component sections;

providing an interposer having a plurality of conductive cavities on a recessed top surface;

providing a series of contiguous conductive ridges being positioned in between each adjacent said cavities;

providing second shielding means disposed on at least one of the interior surfaces of said conductive cavities and adjacent said respective conductive cavities;

mounting said circuit module over said interposer, so that said spaced electrical component sections are disposed inside a space of said respective conductive cavities, forming a plurality of closed electromagnetic interference shielded enclosures for holding said respective spaced electrical component sections therein by overlapping said conductive spacers, from a top-down perspective, to said respective conductive ridges so that said first shielding means is electrically coupled to said second shielding means; and forming an encapsulation over said interposer and said circuit module;

whereby said circuit module can be assembled and individually tested before being disposed and bonded above said interposer, and said electromagnetic interference shielded integrated circuit package further enables simplified inspection as well as functional testing and eliminates the need of multiple bulky shield cans so as to enable compact and thinner system in package design for a complex electronics system.

* * * * *